United States Patent [19]

Huie

[11] Patent Number: 4,745,083
[45] Date of Patent: May 17, 1988

[54] METHOD OF MAKING A FAST IGFET

[75] Inventor: Wing K. Huie, North Wales, Pa.

[73] Assignee: Sprague Electric Company, North Adams, Mass.

[21] Appl. No.: 932,250

[22] Filed: Nov. 19, 1986

[51] Int. Cl.[4] .................................. H01L 21/265
[52] U.S. Cl. .................................. 437/45; 437/57; 437/58; 437/149; 437/152; 357/42; 357/91; 357/23.5
[58] Field of Search .............. 29/571, 576 B, 577 C; 148/187, 1.5; 357/42, 91; 437/57, 45, 149

[56] References Cited

U.S. PATENT DOCUMENTS

| | | | |
|---|---|---|---|
| 4,196,507 | 4/1980 | Baptiste | 437/45 |
| 4,197,630 | 4/1980 | Kamprath | 437/45 |
| 4,198,252 | 4/1980 | Hsu | 437/45 |
| 4,257,826 | 3/1981 | Matalone, Jr. | 437/52 |
| 4,307,411 | 12/1981 | Carnes et al. | 437/45 |
| 4,351,099 | 9/1982 | Takagi et al. | 437/45 |
| 4,354,309 | 10/1982 | Gardiner et al. | 29/578 |
| 4,356,042 | 10/1982 | Gedaly et al. | 437/45 |
| 4,495,693 | 1/1985 | Iwahashi et al. | 29/571 |
| 4,514,893 | 5/1985 | Kinsbron et al. | 437/45 |
| 4,584,027 | 4/1986 | Metz, Jr. et al. | 437/57 |
| 4,598,460 | 7/1986 | Owens et al. | 29/571 |

*Primary Examiner*—Brian E. Hearn
*Assistant Examiner*—Beverly A. Pawlikowski

[57] ABSTRACT

An integrated circuit including CMOS transistors and an EPROM device by a method including selectively implanting threshold adjusting atoms of P-type in the channel regions of the N-type transistors while exposing the whole device area of the P-channel transistor. Subsequently, the sources and drains of the N-channel transistors are selectively implanted using the gates as a self-aligning mask portion. The PN-junction capacitance of the sources and drains of the N-channel transistors are thereby kept low and not subject to the degrading effects of the threshold adjusting implant. The P-channel is also affected and source drain capacitances there are reduced so that the speed of all three types of transistors are enhanced. Only high-yield process steps are included.

9 Claims, 2 Drawing Sheets

METHOD OF MAKING A FAST IGFET

BACKGROUND OF THE INVENTION

This invention relates to insulated gate field effect transistors (IGFET) and more particularly to such a transistor exhibiting a small PN junction capacitance between the substrate of one type conductivity and the source and/or drain of the other conductivity type.

In general, the limitations on operating speed of IGFETs are imposed mainly by device gain and capacitances including those of the PN junctions of the device itself that are in the load circuit.

Since the highly conductive source and drain regions have a much higher dopant concentration than does the substrate, junction capacitance of source and drain can be reduced by using a higher resistivity substrate. However, the minimum practical impurity concentration in the substrate of an integrated circuit is that for which the junction depletion width is not the limiting factor to packing density.

A known solution to this problem is to implant impurities of opposite conductivity to that of the substrate to the specific depth of the source/drain-substrate junctions to create a thin intrinsic region just under the source and drain. However, this process entails a subsequent annealing step that further drives all previously incorporated impurities. That annealing is preferably avoided as being additionally complicating and degrading of integrated circuit performance.

A widely used approach for making IGFET's includes a blanket ion implantation of impurities through an oxide layer into an entire device area to adjust the threshold of the IGFET device. Then a blanket polysilicon layer is deposited, a photoresist mask is formed thereover and through the mask the polysilicon is etched away leaving only a polysilicon gate. Source and drain regions are then formed using the gate as a mask. An example of such a self-aligned gate method is found in the patent to Owens et al, U.S. Pat. No. 4,598,460 issued July 8, 1986 and assigned to the same assignee as is the present invention. However, if high concentration channel doping is included throughout the device area, the junction capacitances of source and drain increases as a direct result of that blanket channel-adjust and device speed is thereby diminished.

To overcome this problem it has been proposed that the channel-adjust implantation be accomplished selectively at the gate area only through both the oxide layer and an overlying thin layer of polysilicon. The polysilicon is sputter deposited. It is impossible to use the more efficient chemical vapor deposition method because it must be executed at temperatures no lower than about 400° C. which would destroy the underlying photoresist. Then using the same mask a high-melting-metal and silicon are cosputtered. The mask and unwanted metal are removed by a lift off process and the metal and silicon are sintered at about 900° C. to form a compound self-aligned gate consisting of a first layer of polysilicon and a second layer of metal silicide.

This process retains the advantage of self-aligned gates but is complex, expensive and critical to control due at least to the use of the critical mask lift off steps, the metal silicde deposition steps, and the high temperature anneal step. The lift off process is particularly critical because if, at any point in an aperture of the photoresist mask the photoresist wall is not almost absolutely vertical, the silicide at that point will not be discontinuous and the mask will not lift off.

It is therefore an object of this invention to overcome the shortcomings in the prior art and to provide a relatively simple and reliable method for making a FET having a small PN junction capacitance between the substrate and the source and/or drain.

SUMMARY OF THE INVENTION

A method for making an insulated gate field effect transistor (IGFET) includes the steps of selectively doping at a FET gate site a region of a semiconductor substrate of one conductivity type with impurities of the one type for adjusting the channel threshold voltage of the FET. This doping is effected through a mask that shields the drain site and/or the source site from the dopant. The first mask is removed and a second mask is formed covering the gate site and having openings over the source and drain sites. The exposed polysilicon is etched away to define the polysilicon gate. Subsequently, the source and drain are formed by doping the substrate through the openings of the second mask with N-type impurities.

This invention stems from the recognition that in substantially all IGFET devices of the prior art the standard practice of providing a blanket implantation of channel adjusting impurities contributes alien impurities to the dominant impurities of opposite type that form the source and drain. After all of the heating steps to which these alien impurities are subjected during device manufacture, a significant diffusion of them ensues driving them below the source and drain that add to the like impurities of the substrate. Thus the junction capacitance of source-to-substrate or drain-to-substrate is enhanced and the maximum speed at which the IGFET operates is reduced.

In some circuit positions, the speed of an IGFET is limited by the drain-to-substrate and not the source-to-substrate capacitance, e.g. the pull down transistor in a CMOS stage. There are also circuit roles for an IGFET wherein speed of transistor operation is limited by the source-to-substrate capacitance and not the drain-to-substrate capacitance, e.g. the pull up transistor in a CMOS circuit. In these two cases, respectively, it is only necessary to mask off the drain or the source during the channel doping.

In other cases, such as in a programmable logic array, the role of a memory IGFET (e.g. an EPROM device) may change from one wherein the source is at signal ground to one wherein the drain is at signal ground. In this case, low drain-to-substrate and source-to-substrate capacitance is desirable for high speed operation and both source and drain will be masked off during the channel adjust doping step.

DESCRIPTION OF THE PREFERRED EMBODIMENTS

Figure 1:
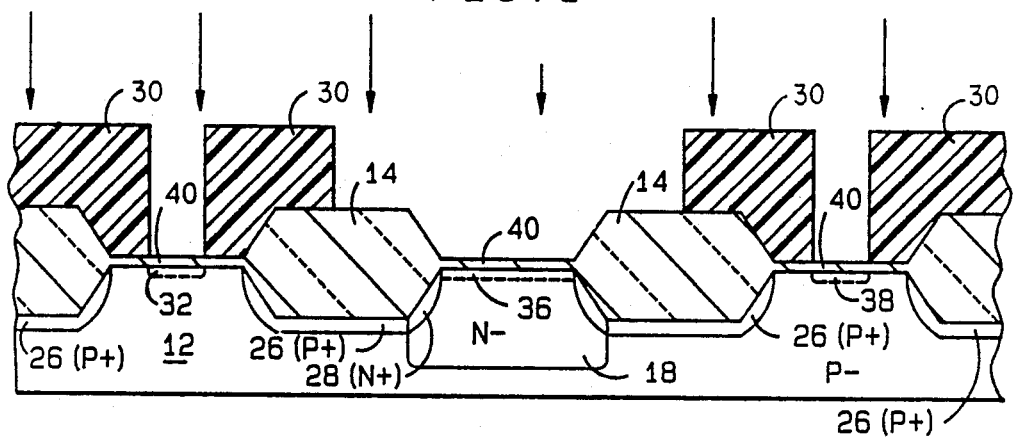
FIGS. 1–6 illustrate a preferred process of this invention for fabricating an integrated CMOS EPROM.

Employing the process of this invention for making an integrated circuit electrically programmable read only memory (EPROM) with CMOS peripheral circuits, certain early steps are executed that provide an intermediate structure illustrated in FIG. 1. These early steps are described and illustrated in detail in the above-mentioned patent U.S. Pat. No. 4,598,460 and this application is incorporated by reference herein. Those early steps are as follows.

A P-type substrate surface upon which a self-aligned EPROM and both P-channel and N-channel transistors are to be formed is completely covered with a thin silicon dioxide layer 14 that is formed by exposing substrate 12 to a high temperature in the presence of steam. After this initial oxidation, a conventional photoresist etch is performed. In this etching step, a photoresist mask is used to selectively etch and create an aperture in the oxide layer.

This is followed by an N-well ion implant wherein N-type ions such as phosphorous ions in the order of $10^{12}$ ions/cm$^2$ bombard the entire substrate surface. However, only the region of substrate 12 beneath the oxide aperture receives these N-type ions causing a predetermined concentration of impurities in region 18.

Following the N-type implant, the photoresist layer is stripped, and an N-well diffusion is performed. In this step, the substrate is raised to a high temperature, approximately 1200°. This high temperature heating drives the N-type dopant impurities that diffuse and form an N-well 18 in FIG. 1. Before the diffusion, well 18 had a depth of only a few thousand angstroms. After the diffusion, it has a depth of approximately 30,000 angstroms, and ultimately, after all of the subsequent heating steps, the N-type impurities concentration at a depth of 0.2 micron becomes about $1 \times 10^{\neq}$ atoms/cm$^2$. The P-channel transistor is to be built in this N-well 18.

Silicon nitride is then deposited on the surface of oxide layer 14 forming a nitride layer that is then selectively etched away through a photoresist masking layer. The masking layer msks all the regions where a device is to be built, whether the device is an EPROM device, a P-channel transistor, or an N-channel transistor. This etching removes the regions of the silicon nitride layer not covered by the photoresist "device" mask.

Following the nitride etch, P+ guard rings 26 are formed by a blanket boron implant that is masked off in the device regions by the remaining patches of nitride and photoresist.

After the formation of guard rings 26, the photoresist masking layer is removed and a new photoresist masking layer is provided which is used with the remaining patches of the nitride layer as masks to a phosphorous ion implant to create N+ guard ring 28 within N-well 18.

The photoresist layer is then removed and a field oxidation is performed during which the substrate is subjected to a high temperature for a long period of time to cause oxide layer 14 to become greatly enlarged as shown in FIG. 1. The regions of oxide layer 14 beneath the remaining patches of the nitride layer are not affected except for regions right at the edges of the nitride layer. The remaining patches of the nitride layer are then removed.

The removal of the nitride layer is followed by forming over oxide layer 14 a photoresist mask 30 with openings that expose the source, drain and channel regions, i.e. the entire device region, at the site of the P-channel transistor, and only the channel regions at the site of the N-channel transistor and EPROM device. Now an implantation of $1.8 \times 10^{12}$ boron ions/cm$^2$ at 60 KEV is effected through the mask 30 to adjust the thresholds of the N-channel devices as well as the P-channel transistor. The mask 30 prevents implanting boron ions at the sites of the sources and drains of the N-channel EPROM device and of the N-channel transistor. Mask 30 is then removed. This ultimately results, after all of the heating steps, in a peak boron concentration in the channel regions 36 and 38 of $3 \times 10^{16}$ atoms/cm$^2$.

Region 36, which is the channel region of the P-channel transistor, also receives P-type implants during this step. The region 36 was doped independently with N-type impurities in an earlier step to form the N-well 18. During that independent doping of well regions 18, the boron implant shown was considered in advance and compensated for to realize the desired threshold voltage. The mask 30 having an aperture over the entire device region of the P-channel transistor advantageously enables the further channel-adjusting boron atoms to be implanted in the source gate and drain sites of this device. This leads to an overall reduction of dominant N-type impurities at the source/drain to well PN junctions.

At this point in the process, the thin portions 40 of the silicon dioxide layer 14 that cover the channel region 32 of the EPROM, the channel region 36 of the P-channel transistor and the channel region 38 of the N-channel transistor have a thickness that is the result of several heating steps and is thus not well controlled. It is here that the oxide thickness will also determine the threshold of the EPROM and the N-channel and P-channel devices. Region 40 is therefore etched and channel regions 32, 36 and 38 are exposed.

Figure 2:
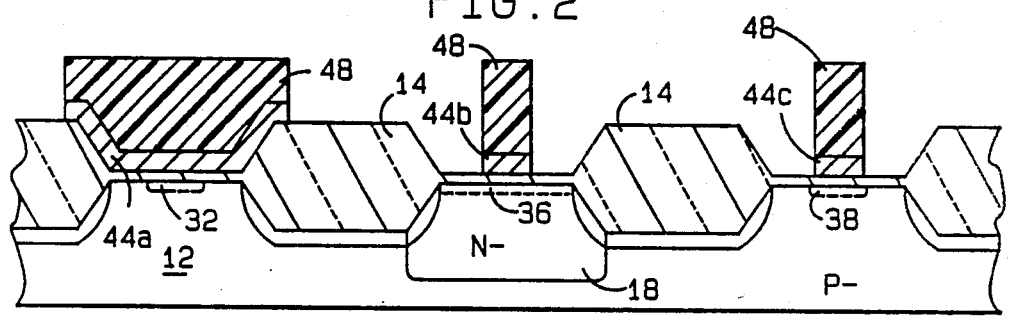

FIG. 2 shows an oxide layer 42 in the same location from which the thin portions of oxide layer 14 was removed. Oxide layer 42 is grown at these locations in a channels-oxidation step at 950° C. in 10% steam under very precise control.

The oxidation to form layer 42 is followed by deposition of a blanket layer of polysilicon (44 not shown altogether). This layer is produced by a standard chemical vapor deposition (CVD) step including placing the substrate in a vacuum hot-wall furnace, drawing a vacuum, raising the temperature to 625° C. and admitting silane (SiH$_4$) gas to a subatmospheric pressure. When the polysilicon thickness has reached about 4000 angstroms, the deposition is terminated.

The polysilicon is preferably rendered more conductive by ion implantation. Alternative doping may be accomplished by a standard phosphorous diffusion step, known as POCl$_3$ doping, to impart conductivity amounting to about 15 ohms per square. The polysilicon blanket layer covering the whole surface of the substrate provides an efficient mask for preventing penetration of the doping impurities anywhere into or adjacent the underlying substrate.

Thinner polysilicon layers may be used, preferably down to no less than about 2000 to 2500 angstroms below which its masking efficiency and conductivity tend to become inadequate.

A photoresist masking layer 48 is formed over the area of the entire EPROM device, and in the direction of drain to source just over a central area of each of the P-channel and N-channel devices to define the gates of the P-channel and N-channel devices. This is followed by a silicon etch to selectively remove portions of polysilicon layer (44). Thus, remaining portions 44a and the polysilicon gates 44b and 44c of the P-channel and N-channel devices are at this point in the process as shown in FIG. 2.

Figure 3:
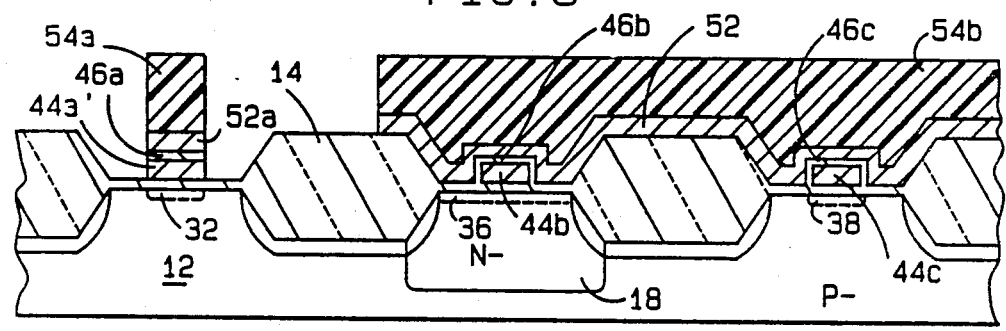

The photoresist layer 48 is then stripped away and polysilicon gate regions 44a, 44b and 44c are oxidized to form the silicon dioxide layers 46a, 46b and 46c as shown in FIG. 3.

A second blanket layer of polycrystalline silicon (52 not shown) is deposited upon the substrate. This polycrystalline layer (52) is doped with an N-type dopant. A photoresist layer portion 54b covers the P-channel transistor and the N-channel transistor. Photoresist portion 54a covers a central part of the EPROM device site and overlies the second polysilicon layer (52) and first layer (44) of N+ polysilicon layer 52a above the EPROM channel.

A first etch is an N+ polysilicon etch which removes N+ polysilicon layer (52) except for the portion below photoresist layer 54a. A second etch is a buffered-hydrofluoric polycrystalline-oxide etch which removes polycrystalline oxide layer 46 except for the portion below photoresist layer 54a. The final etch is a polysilicon etch which removes polysilicon layer 44a except for the portion 44a' below photoresist layer 54a.

The structures below photoresist layer 54a are EPROM control gate 52a which is formed from N+ polysilicon layer (52), interpoly oxide layer 46a which is formed from polysilicon oxide layer (46), and floating gate 44a' which is formed from polysilicon layer 44.

Following the series of etches to form the EPROM gate structures, photoresist layers 54a and 54b are stripped and another photoresist layer (56 not shown) is formed to cover the EPROM device site, leaving open the polysilicon layer 44b above P-channel 36 and leaving open the polysilicon layer 44c above the N-channel region 38.

A polysilicon etch is then performed removing polysilicon layer portion 52b over the N-channel and P-channel regions, and not the portion 52a below photoresist layer (56). The photoresist layer (56) is then removed and a polysilicon oxidation step is performed. This oxidation step results in the formation of the polysilicon oxide layer 62 on the EPROM gate structure shown in FIG. 7, and also adds thickness to the oxide layer 46 that covers P-channel gate 44b and N-channel gate 44c.

Figure 4:
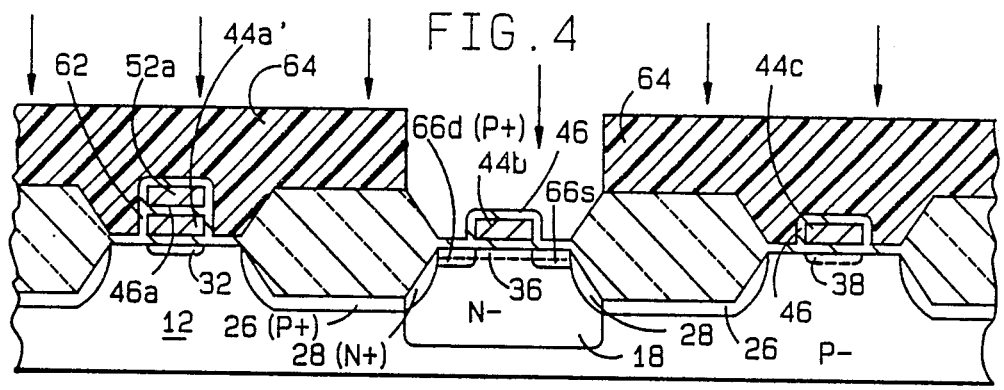

Referring to FIG. 4, photoresist masking layer 64 is deposited and an aperture is formed in layer 64 above the site in N-well 18 where the P-channel transistor is to be formed. A P-type ion implant is performed with masking layer 64 preventing ions from being implanted in the N-channel transistor channel region 38 and in the EPROM device channel region 32. P-channel gate 44b, along with its oxide layer 46b, prevent P-type ions from entering channel region 36 underneath. The enlarged regions of oxide layer 14 prevent the P-type ions from being implanted in N+ guard rings 28. The result is the formation of P+ regions 66. P+ regions are the source 66s and drain 66d regions of the P-channel transistor.

Figure 5:
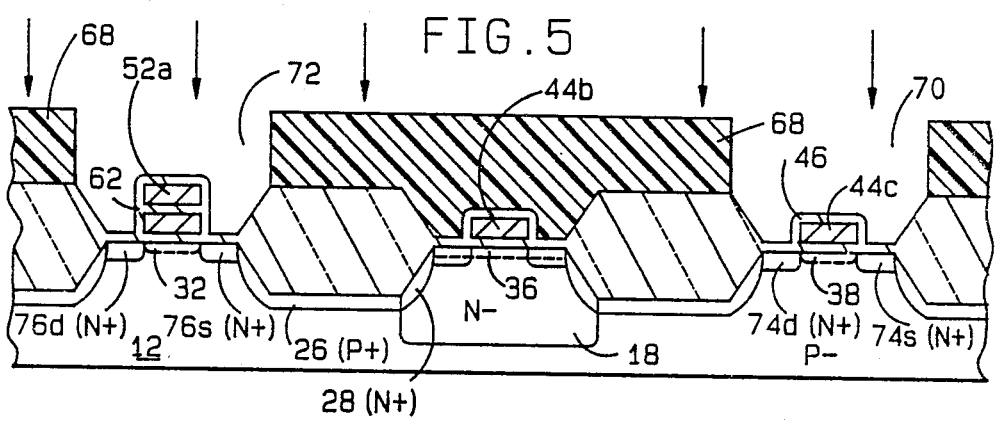

Referring now to FIG. 5, the source and drain regions of the EPROM and the N-channel transistor are formed. Photoresist layer 64 is stripped and a new photoresist mask layer 68 is formed. Photoresist layer 68 has aperture 70 above the region where the N-channel transistor is to be formed and aperture 72 above the region where the EPROM device is to be formed. Following the formation of apertures 70 and 72 in layer 68, N-type arsenic ions are implanted. N-channel transistor gate 44c and its oxide layer 46 protect a portion of N-channel region 38 from receiving the ion implants. This results in the formation of N+ source regions 74s and 76s and drain regions 74d and 76d which define gate-aligned channels 32 and 38.

Of course, it is generally necessary to insure that the doping of the channel region to adjust the transistor threshold voltage completely spans the distance source to drain. At first consideration this suggests that it will be difficult in the process of this invention to realize the registration accuracy necessary to attain that objective. However, that is not the case because in the mask (30) for selectively exposing the channels to threshold adjusting impurities, the doped channel regions become wider than the mask aperture dimensions due to lateral diffusions of the impurities; and because in the subsequent mask (48) for selectively etching polysilicon and defining the gates there are mask islands corresponding to the gates and the underlying polysilicon is undercut by the etchant so that the dimensions of the resulting gates are less than those of the mask islands. Thus as a practical matter the dimensions of the apertures of the first mask are preferably made equal to the dimensions of the islands of the second mask greatly simplifying design and without the need for different masks dimensions to compensate for worse case misregistration of sequentially employed masks and/or without making the costly effort to achieve extraordinarily tight mask registration.

This practice of using equal dimensions of the successive masks, at least in the direction of from source to drain, causes a small overlap of the channel adjusted regions and the source and drain. However, this small overlap increases the junction capacitances insubstantially.

Figure 6:
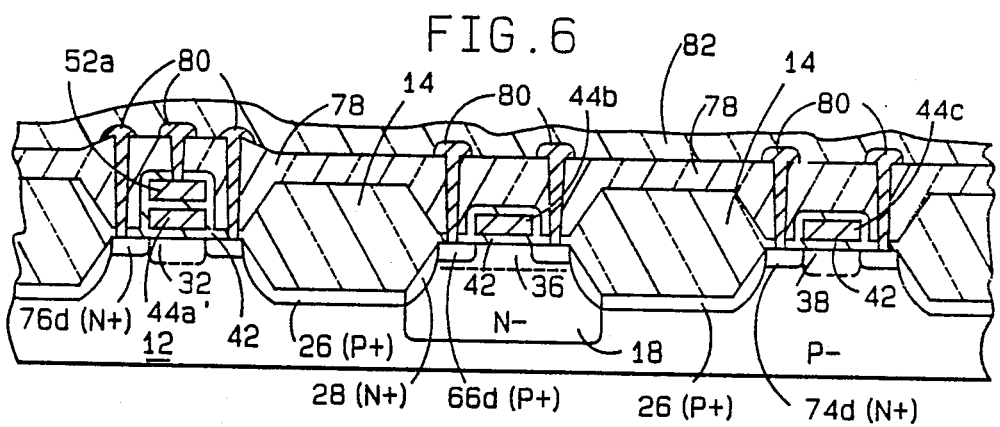

Referring now to FIG. 6, the substrate is subjected to heating at about 900° C. to drive the source and drain impurities further into the substrate. This results in a depth of 0.3 micron for sources and drains 76d, 76s, 66d, 66s, 74d and 74s, whereas the threshold-adjusting boron in the channels is driven deeper also. The P/P-junction defining regions 32 and 38 become 0.8 micron deep and the N-/N junction defining region 36 becomes about 0.5 micron deep.

Again referring to FIG. 6, a contact etching step is performed. In this step, glass is deposited on the surface and heated until it reflows slightly, thereby forming reflow glass layer 78. A photoresist mask is then deposited and contact holes are cut to all source, drain and gate regions. The photoresist is then removed.

A metal alloy is then deposited. This metal alloy comes in contact with the areas beneath the apertures which have been etched in glass layer 78, thereby forming metal contacts 80. This is followed by a metal photoresist masking and a metal etch which leaves metal above the regions to which contact is required. A passivation layer 82 is then deposited and etched, resulting in the final structure as shown in FIG. 6.

What is claimed is:

1. A method for making integrated CMOS transistors comprising:
    (a) growing a layer of silicon dioxide on the surface of a silicon substrate of one conductivity type;
    (b) forming a first photoresist mask over said silicon dioxide layer, said mask having an aperture registered with the site at which the gate of one FET device is to be formed in said substrate;
    (c) selectively implanting through said mask aperture and through said silicon dioxide impurity ions of said one conductivity type to adjust the threshold of said one FET device;
    (d) removing said first mask by a standard dissolution step, and by a standard chemcial vapor deposition step depositing a blanket layer of polycrystalline silicon over said oxide layer;

(e) forming a second mask that is patternwise complementary to said first mask to the extent that at the device region of said FET said second mask has a portion selectively covering said one-device gate site and exposing the adjacent source and drain sites;

(f) etching away the portions of said polysilicon layer that are exposed through said second mask to form said gate from a portion of said polysilicon layer;

(g) doping with impurities of said opposite conductivity type at said source and drain sites to form said source and drain using said gate as a self-aligning mask; and (h) diffusing impurities of said opposite conductivity type in another FET device region prior to growing said silicon dioxide layer to form a well of opposite conductivity type, said first mask having an aperture over the entire of said another FET region so that said selectively implanting to adjust the threshold of one said FET device also effects a blanket implanting of opposite type impurities into said another device region to adjust the threshold of and increase the speed of said another device, said second mask additionally selectively covering the gate site of said another FET device and being open over the adjacent source and drain sites whereby said etching also removes portions of said polysilicon layer adjacent to said another-device-gate site to form said another-gate site to form said another-device gate and doping with impurities of said one conductivity type at said source and drain sites of said another device using said another-device gate as a self-aligning mask.

2. The method of claim 1 wherein said chemical vapor deposition is accomplished at a temperature within the range 400° C. to 650° C.

3. The method of claim 1 wherein the thickness of said polysilicon layer is greater than 2000 angstroms.

4. The method of claim 1 wherein the thickness of said polysilicon layer is greater than 2500 angstroms.

5. The method of claim 1 wherein said dopings to form said source and drain is accomplished by ion implantations.

6. The method of claim 1 wherein after depositing said blanket layer of polysilicon and before forming said second mask, doping said blanket polysilicon layer with impurities to render said blanket layer substantially more conductive.

7. The method of claim 1 wherein said portion of said second mask has the same dimension in the source drain direction as said aperture of said first mask.

8. A method for making integrated CMOS transistors comprising:

(a) forming at one surface region of a silicon substrate of one conductivity type a well of the other conductivity type; and (b) at a part of said surface region having a one conductivity type in which one CMOS transistor is to be formed, selectively implanting ions of said one type only in the channel region thereof to adjust the threshold of said one transistor, while simultaneously implanting said one conductivity type ions in all of a part of said well in which another and complementary CMOS transistor is to be formed to adjust the threshold of said complementary transistor, so that all of the source/drain to substrate capacitances of said transistors are reduced by said threshold adjusting implantation.

9. The method of claim 8 additionally comprising forming one gate over said channel region of said one transistor and forming another gate over the channel region of said complementary transistor; and doping with impurities of said opposite conductivity type the source and drain sites of said one transistor using said one gate as a self-aligning mask and doping with impurities of said one conductivity type the source and drain sites of said complementary transistor using said another gate as a self-aligning mask.

* * * * *